US 6,661,050 B2

(12) United States Patent
Tzeng et al.

(10) Patent No.: US 6,661,050 B2
(45) Date of Patent: Dec. 9, 2003

(54) MEMORY CELL STRUCTURE WITH TRENCH CAPACITOR AND METHOD FOR FABRICATION THEREOF

(75) Inventors: Kuo-Chyuan Tzeng, Hsin-Chu (TW); Chen-Jong Wang, Hsin-Chu (TW); Chung-Wei Chang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/102,280

(22) Filed: Mar. 20, 2002

(65) Prior Publication Data

US 2003/0178661 A1 Sep. 25, 2003

(51) Int. Cl.[7] .................. H01L 27/108; H01L 29/76; H01L 29/94; H01L 31/119
(52) U.S. Cl. ........................... 257/301; 257/906
(58) Field of Search ................... 257/296, 301, 257/306, 310, 312, 314, 315, 334, 336, 339, 906

(56) References Cited

U.S. PATENT DOCUMENTS

| 4,922,460 | A | * | 5/1990 | Furutani et al. | 365/207 |
| 5,182,224 | A | * | 1/1993 | Kim et al. | 438/301 |
| 5,198,995 | A | | 3/1993 | Dennard et al. | 365/149 |
| 6,097,076 | A | * | 8/2000 | Gonzaler et al. | 257/513 |
| 6,200,851 | B1 | * | 3/2001 | Arnold | 438/243 |
| 6,475,865 | B1 | * | 11/2002 | Yang et al. | 438/270 |

OTHER PUBLICATIONS

MoSys Inc. "The Ideal SoC Memory: 1T-SRAM", 2000 IEEE, pp. 32–36.

* cited by examiner

Primary Examiner—David Nhu
(74) Attorney, Agent, or Firm—Tung & Associates

(57) ABSTRACT

Within both a memory cell structure and a method for fabricating the memory cell structure there is employed a storage capacitor formed within a trench adjoining an active region of a semiconductor substrate. Within the memory cell structure and the method for fabrication thereof, both the active region of the semiconductor substrate and the trench are contained within a doped well within the semiconductor substrate.

7 Claims, 3 Drawing Sheets

MEMORY CELL STRUCTURE WITH TRENCH CAPACITOR AND METHOD FOR FABRICATION THEREOF

BACKGROUND OF THE INVENTION

1. Field of the Invention

The present invention relates generally to methods for fabricating memory cell structures within semiconductor integrated circuit microelectronic fabrications. More particularly, the present invention relates to methods for fabricating, with enhanced performance, memory cell structures within semiconductor integrated circuit microelectronic fabrications.

2. Description of the Related Art

Semiconductor integrated circuit microelectronic fabrications are formed from semiconductor substrates over which are formed patterned conductor layers which are separated by dielectric layers.

Ubiquitous in the art of semiconductor integrated circuit microelectronic fabrication are memory cell structures which are employed when fabricating memory cells within semiconductor integrated circuit microelectronic fabrications. Memory cell structures within semiconductor integrated circuit microelectronic fabrications typically comprise a field effect transistor (FET) device as a switching element. Within a memory cell structure, one of the source/drain regions within the field effect transistor (FET) device is electrically connected to a storage capacitor, while the other of the source/drain regions within the field effect transistor (FET) device is electrically connected to a bitline within the memory cell structure. Finally, a gate electrode within the field effect transistor (FET) device serves as a wordline within the memory cell structure.

While memory cell structures are thus clearly desirable in the art of semiconductor integrated circuit microelectronic fabrication and often essential in the art of semiconductor integrated circuit microelectronic fabrication, memory cell structures are nonetheless not entirely without problems in the art of semiconductor integrated circuit microelectronic fabrication. In that regard, memory cell structures are often difficult to fabricate within semiconductor integrated circuit microelectronic fabrications with enhanced performance, in particular within the context of decreased semiconductor substrate areal dimensions.

It is thus desirable in the art of semiconductor integrated circuit microelectronic fabrication to fabricate within semiconductor integrated circuit microelectronic fabrications memory cell structures with enhanced performance.

It is towards the foregoing object that the present invention is directed.

Various memory cell structures, and methods for fabrication thereof, have been disclosed in the art of semiconductor integrated circuit microelectronic fabrication.

Included among the memory cell structures and methods for fabrication thereof, but not limited among the memory cell structures and methods for fabrication thereof, are memory cell structures and methods for fabrication thereof disclosed within Dennard et al., in U.S. Pat. No. 5,198,995 (a dynamic random access memory (DRAM) cell structure which employs a trench capacitor structure which in part comprises a semiconductor substrate); and Leung et al., in "The Ideal SoC Memory: 1T-SRAM," IEEE 0-7803-6598-4/00 (2000) (a static random access memory (SRAM) cell structure which employs a planar capacitor structure which in part comprises a semiconductor substrate).

Desirable in the art of semiconductor integrated circuit microelectronic fabrication are additional memory cell structures, and methods for fabrication thereof, which may be fabricated with enhanced performance.

It is towards the foregoing object that the present invention is directed.

SUMMARY OF THE INVENTION

A first object of the present invention is to provide a memory cell structure, and a method for fabricating the memory cell structure, for use within a semiconductor integrated circuit microelectronic fabrication.

A second object of the present invention is to provide a memory cell structure and a method for fabrication thereof in accord with the first object of the present invention, wherein the memory cell structure is fabricated with enhanced performance.

A third object of the present invention is to provide a memory cell structure and a method for fabrication thereof in accord with the first object of the present invention and the second object of the present invention, wherein the method is readily commercially implemented.

In accord with the objects of the present invention, there is provided by the present invention a memory cell structure and a method for fabricating the memory cell structure.

To practice the method of the present invention, there is first provided a semiconductor substrate having formed therein a trench which adjoins an active region of the semiconductor substrate. There is then ion implanted the semiconductor substrate to form therein a doped well which includes the active region of the semiconductor substrate and the trench. There is then formed into the trench a capacitive dielectric layer having formed thereupon a capacitor plate layer. Finally, there is also formed within and upon the active region of the semiconductor substrate a field effect transistor (FET) device, where a source/drain region within the field effect transistor (FET) device is electrically connected with the capacitor plate layer.

The method of the present invention contemplates a memory cell structure fabricated in accord with the method of the present invention.

The present invention provides a memory cell structure, and a method for fabrication thereof, for use within a semiconductor integrated circuit microelectronic fabrication, wherein the memory cell structure is formed with enhanced performance.

The present invention realizes the foregoing objects by forming within a memory cell structure for use within a semiconductor integrated circuit microelectronic fabrication a storage capacitor within a trench adjoining an active region of a semiconductor substrate, wherein both the active region and the trench are included within a doped well formed within the semiconductor substrate.

The method of the present invention is readily commercially implemented.

The present invention employs methods and materials as are otherwise generally known in the art of semiconductor integrated circuit microelectronic fabrication, but employed within the context of a specific process sequencing to provide a specific memory cell structure in accord with the present invention. Since it is thus at least in part a specific process sequencing and a specific memory cell structure which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a memory cell structure, and a method for fabrication thereof, for use within a semiconductor integrated circuit microelectronic fabrication, wherein the memory cell structure is formed with enhanced performance.

The present invention realizes the foregoing objects by forming within a memory cell structure for use within a semiconductor integrated circuit microelectronic fabrication a storage capacitor within a trench adjoining an active region of a semiconductor substrate, wherein both the active region and the trench are included within a doped well formed within the semiconductor substrate.

Figure 1:
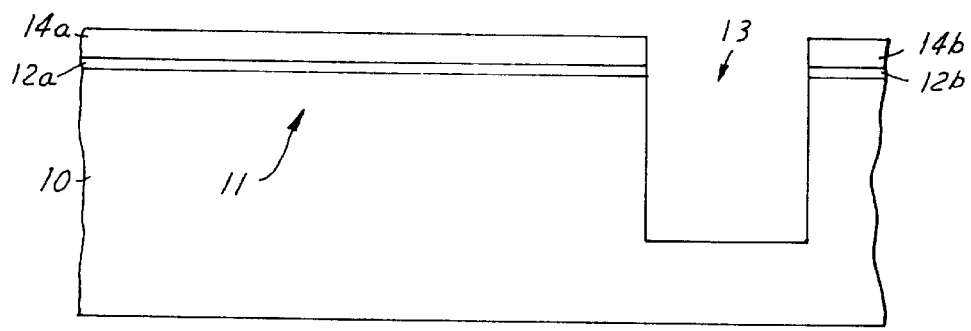
FIG. 1, FIG. 2, FIG. 3, FIG. 4, FIG. 5, FIG. 6 and FIG. 7 show a series of schematic cross-sectional diagrams illustrating the results of progressive stages in forming, in accord with a preferred embodiment of the present invention, a memory cell structure within a semiconductor integrated circuit microelectronic fabrication.
Figure 7:
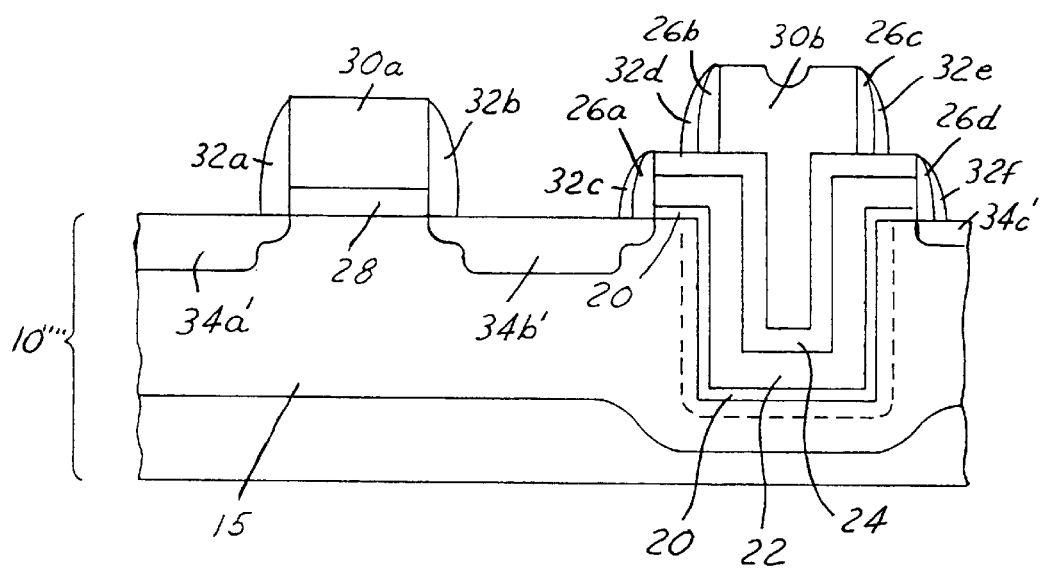

Referring now to FIG. 1, to FIG. 7, there is shown a series of schematic cross-sectional diagrams illustrating the results of progressive stages of forming, in accord with a preferred embodiment of the present invention, a memory cell structure within a semiconductor integrated circuit microelectronic fabrication.

Shown in FIG. 1 is a schematic cross-sectional diagram of the semiconductor integrated circuit microelectronic fabrication at an early stage in fabrication thereof of the memory cell structure in accord with the preferred embodiment of the present invention.

Shown in FIG. 1 is a semiconductor substrate 10 having formed therein a trench 13 which adjoins an active region 11 of the semiconductor substrate 10. Similarly, within the schematic cross-sectional diagram of FIG. 1, the semiconductor substrate 10 has formed thereupon a pair of patterned pad oxide layers 12a and 12b in turn having formed thereupon a pair of patterned silicon nitride layers 14a and 14b which further assist in defining the trench 13 within the semiconductor substrate 10.

Within the preferred embodiment of the present invention, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably a P-silicon semiconductor substrate of dopant concentration from about 1E15 to about 1E16 dopant atoms per cubic centimeter.

Within the preferred embodiment of the present invention with respect to the pair of patterned pad oxide layers 12a and 12b, the pair of patterned pad oxide layers 12a and 12b is typically and preferably formed employing a thermal oxidation method to form the pair of patterned pad oxide layers 12a and 12b of a thermal silicon oxide material formed to a thickness of from about 90 to about 150 angstroms upon the semiconductor substrate 10.

Within the preferred embodiment of the present invention with respect to the pair of patterned silicon nitride layers 14a and 14b, the pair of patterned silicon nitride layers 14a and 14b is typically and preferably formed employing a chemical vapor deposition (CVD) method to form the pair of patterned silicon nitride layers 14a and 14b of thickness from about 1000 to about 2000 angstroms formed upon the pair of patterned pad oxide layers 12a and 12b.

Finally, within the preferred embodiment of the present invention with respect to the trench 13, the trench 13 is typically and preferably formed with a bidirectional (i.e., areal) linewidth of from about 1.2 to about 1.6 microns within the semiconductor substrate 10 and a depth of from about 5000 to about 8000 angstroms within the semiconductor substrate 10.

Figure 2:
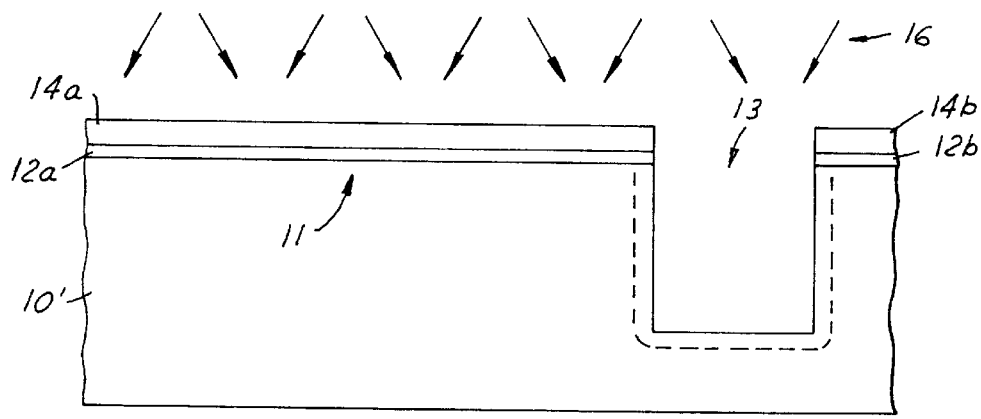

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is ion implanted the sidewalls and bottom of the trench 13, while employing the pair of patterned silicon nitride layers 14a and 14b and the pair of patterned pad oxide layers 12a and 12b as a mask, and in conjunction with a dose of first implanting ions 16, to form an ion implanted semiconductor substrate 10'. A heavily doped region 17 is thus formed within the ion implanted semiconductor substrate 10' at the sidewalls and bottom of the trench 13.

Within the preferred embodiment of the present invention when forming the heavily doped region 17, the polarity and dose of first implanting ions 16 is selected such that a metal oxide semiconductor (MOS) capacitor formed within the trench 13, and employing the ion implanted semiconductor substrate 10' as a capacitor node, operates in a depletion mode. Within the preferred embodiment of the present invention when the semiconductor substrate is a P-semiconductor substrate, the dose of first implanting ions 16 may be provided employing a P dopant, such as boron difluoride, at an ion implantation dose of from about 1E12 to about 6E12 ions per square centimeter and an ion implantation energy of from about 10 to about 25 kev, to provide an implanted depth of from about 300 to about 800 angstroms within both the sidewalls and the bottom of the trench 13. As is understood by a person skilled in the art, the foregoing ion implantation provides for a depletion mode threshold voltage adjustment within a metal oxide semiconductor capacitor form[m]ed employing the ion implanted semiconductor substrate 10'.

Figure 3:
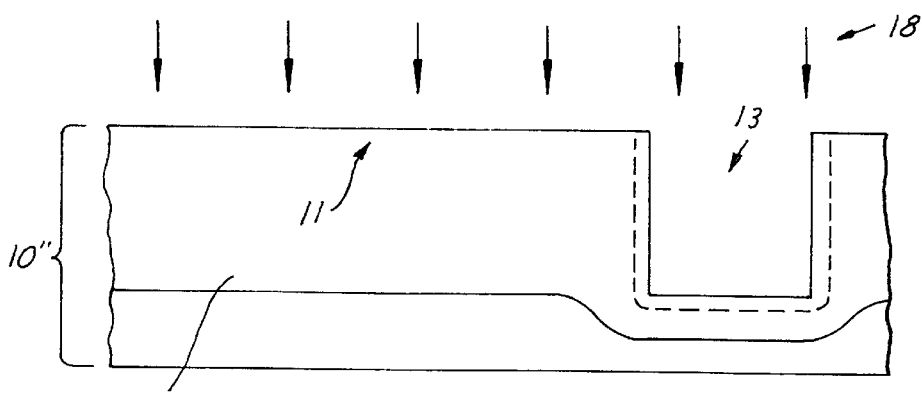

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the pair of patterned silicon nitride layers 14a and 14b and the pair of patterned pad oxide layers 12a and 12b have been stripped from the ion implanted semiconductor substrate 10' as illustrated within the schematic cross-sectional diagram of FIG. 2.

Within the preferred embodiment of the present invention, the pair of patterned silicon nitride layers 14a and 14b may be stripped employing an aqueous phosphoric acid etchant at an elevated temperature, as is conventional in the art of semiconductor integrated circuit microelectronic fabrication. Similarly, the pair of patterned pad oxide layers 12a and 12b may be stripped while employing a hydrofluoric acid based etchant as is also conventional in the art of semiconductor integrated circuit microelectronic fabrication.

Finally, there is also shown within the schematic cross-sectional diagram of FIG. 3 a dose of second implanting ions 18 which is employed for forming a doped well 15 within a twice ion implanted semiconductor substrate 10".

Within the preferred embodiment of the present invention when the semiconductor substrate is a P-semiconductor substrate, the dose of second implanting ions 18 is provided as N implanting ions at an ion implantation dose of from about 3E12 to about 5E13 ions per square centimeter and an ion implantation energy of from about 400 to about 1000 kev when forming the doped well 15 to a depth of from about 10000 to about 15000 angstroms within the twice ion implanted semiconductor substrate 10".

As is illustrated within the schematic cross-sectional diagram of FIG. 3, the dose of second implanting ions 18 is provided nominally non-selectively with respect to the active region 11 of the semiconductor substrate 10 and trench 13 to provide the doped well 15 which includes both the active region 11 of the semiconductor substrate 10 and the trench 13 (i.e., the trench 13 does not penetrate the doped well 15).

Figure 4:
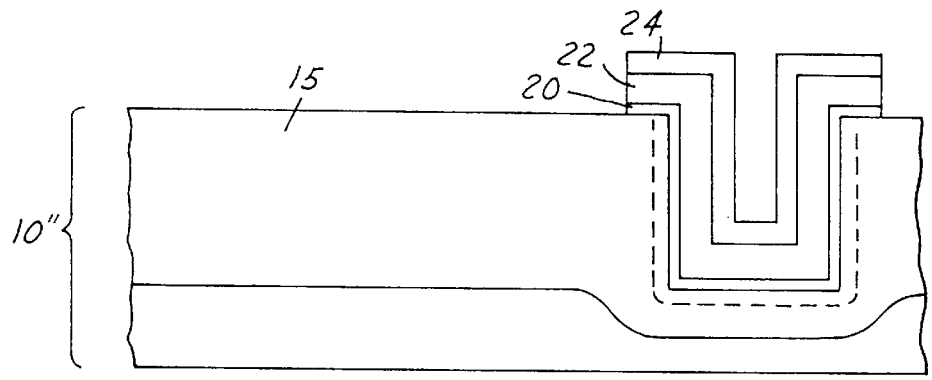

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed into the trench 13: (1) a patterned capacitor dielectric layer 20 having formed thereupon; (2) a patterned capacitor plate layer 22 in turn having formed thereupon; (3) a patterned capping dielectric layer 24. Within the preferred embodiment of the present invention, each of the foregoing three patterned layers may be formed employing methods and materials as are conventional in the art of semiconductor integrated circuit microelectronic fabrication.

Typically and preferably, the patterned capacitor dielectric layer 20 is formed at least in part of a silicon oxide dielectric material formed to a thickness of from about 40 to about 60 angstroms within the trench 13. Similarly, typically and preferably the patterned capacitor plate layer 22 is formed at least in part of a doped polysilicon capacitor plate material formed to a thickness of from about 1000 to about 2000 angstroms upon the patterned capacitor dielectric layer 20. Finally, typically and preferably, the patterned dielectric capping layer 24 is typically and preferably formed of a silicon oxynitride material formed to a thickness of from about 500 to about 1000 angstroms upon the patterned capacitor plate layer 22.

As is understood by a person skilled in the art, each of the three foregoing patterned layers may be formed incident to a selectively photomasked patterning of a series of corresponding blanket layers.

Figure 5:
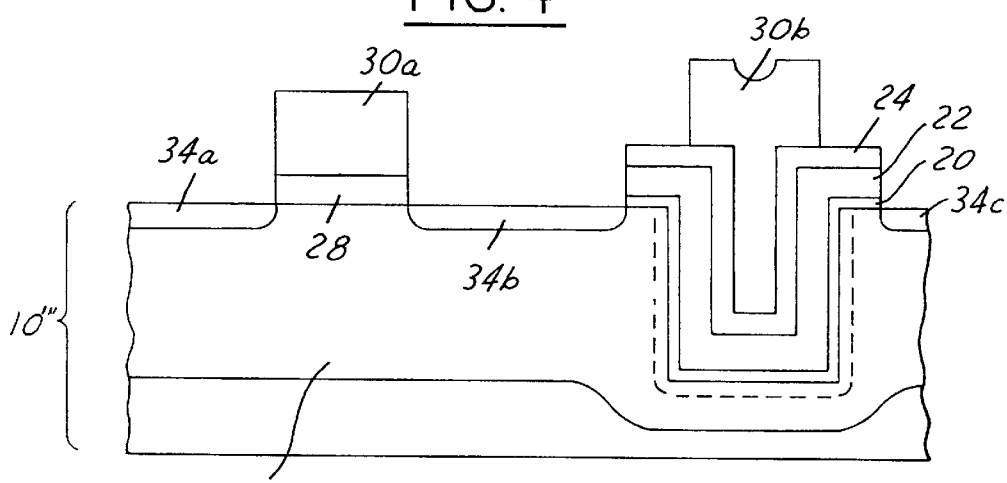

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is: (1) formed upon the active region of the semiconductor substrate a gate dielectric layer 28 having aligned thereupon a gate electrode 30a; and (2) formed upon the patterned capping dielectric layer 24 a corresponding interconnect layer 30b.

Within the preferred embodiment of the present invention, the gate dielectric layer 28 is typically and preferably formed of a silicon oxide gate dielectric material, formed to a thickness of from about 25 to about 40 angstroms. The gate electrode 30a and the interconnect 30b are typically and preferably formed of a doped polysilicon or polycide gate electrode material formed to a thickness of from about 1000 to about 2000 angstroms.

Shown also within the schematic cross-sectional diagram of FIG. 5 is a series of lightly doped extension regions 34a, 34b and 34c, formed into a three times ion implanted semiconductor substrate 10'" while employing at least in part the gate electrode 30a and the patterned capping dielectric layer 24 as a mask. In conjunction with a dose of third implanting ions which is not otherwise illustrated.

Within the preferred embodiment of the present invention, the series of lightly doped extension regions 34a, 34b and 34c is provided at an ion implantation dose of from about 1E13 to about 1E14 dopant ions per square centimeter and of a polarity opposite to that of the doped well 15.

Figure 6:
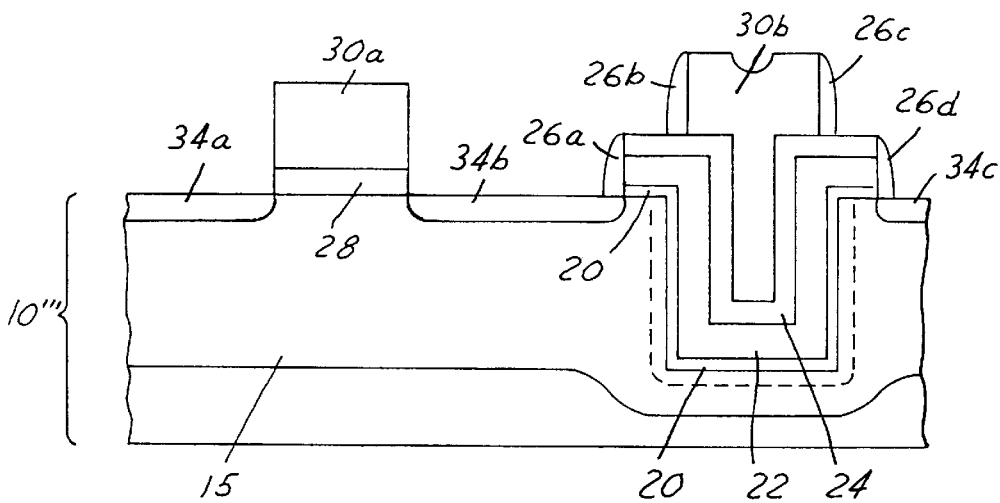

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed: (1) adjoining the sidewalls of the patterned capacitor dielectric layer 20, the patterned capacitor plate layer 22 and the patterned capping dielectric layer 24; as well as (2) the sidewalls of the interconnect 30b, a series of conductor spacer layers 26a, 26b, 26c and 26d.

Within the preferred embodiment of the present invention the series of conductor spacer layers 26a, 26b, 26c and 26d is formed of a conductor material which may be etched to form the series of conductor spacer layers 26a, 26b, 26c and 26d while not appreciably etching the three times ion implanted semiconductor substrate 10'". In order to effect such a result, the series of conductor spacer layers may be formed of a fluorine containing plasma etchable conductor material, such as but not limited to a tungsten conductor material. As is understood by a person skilled in the art, the conductor spacer layer 26a, in particular, electrically connects the lightly doped extension region 24b to the patterned capacitor plate layer 22.

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, there is formed: (1) adjoining a pair of sidewalls of the gate dielectric layer 28 and the gate electrode 30a; and (2) adjoining the series of conductor spacer layers 26a, 26b, 26c and 26d a series of dielectric spacer layers 32a, 32b, 32c, 32d, 32e and 32f.

Within the preferred embodiment of the present invention, the series of dielectric spacer layers 32a, 32b, 32c, 32d, 32e and 32f may be formed employing methods and materials as are otherwise generally conventional in the art of semiconductor integrated circuit microelectronic fabrication.

Finally, there is also shown within the schematic cross-sectional diagram of FIG. 7 a series of source/drain regions 34a', 34b' and 34c' (incorporating the pair of lightly doped extension regions 34a, 34b and 34c) formed into the doped well 15 within at least the active region of the semiconductor substrate while employing at least in part the series of dielectric spacer layers 32a, 32b, 32c and 32f as a mask, to thus form from the three times ion implanted semiconductor substrate 10''' a four times ion implanted semiconductor substrate 10''''. The series of source/drain regions 34a', 34b' and 34c' is formed while employing a dose of fourth implanting ions, also of polarity opposite the doped well 15, but not otherwise illustrated within the schematic cross-sectional diagram of FIG. 7.

Upon forming the semiconductor integrated circuit microelectronic fabrication whose schematic cross-sectional diagram is illustrated in FIG. 7, there is provided in accord with a preferred embodiment of the present invention a memory cell structure with enhanced performance.

The memory cell structure is provided with enhanced performance insofar as the memory cell structure employs a capacitor formed within a trench adjoining an active region of a semiconductor substrate, where both the active region of the semiconductor substrate and the trench are contained within a doped well within the semiconductor substrate.

As is understood by a person skilled in the art, and although not specifically illustrated within the foregoing series of schematic cross-sectional diagrams, there is typically and preferably employed a sacrificial oxide layer incident to each of the ion implantation methods employed within the present invention, such as to preserve integrity of the semiconductor substrate 10. Similarly, while the preferred embodiment of the present invention illustrates the present invention within the context of a P-silicon semiconductor substrate, an analogous invention employing an N-silicon semiconductor substrate is also within the context of the present invention.

As is further understood by a person skilled in the art, the preferred embodiment of the present invention is illustrative of the present invention rather than limiting of the present invention. Revisions and modifications may be made to methods, materials, structures and dimensions employed for fabricating a memory cell structure in accord with the preferred embodiment of the present invention while still forming a memory cell structure in accord with the present invention, further in accord with the accompanying claims.

What is claimed is:

1. A memory cell structure comprising:
   a semiconductor substrate having formed therein a trench which adjoins an active region of the semiconductor substrate;
   a doped well formed within the semiconductor substrate, the doped well including the active region of the semiconductor substrate and the trench such that the trench does not penetrate through the doped well;
   a capacitive dielectric layer formed into the trench;
   a capacitor plate layer formed upon the capacitive dielectric layer; and
   a field effect transistor device formed within and upon the active region of the semiconductor substrate, where a source/drain region within the field effect transistor device is electrically connected to the capacitor plate layer.

2. The memory cell of claim 1 wherein the trench is formed to a depth of from about 5000 to about 8000 angstroms within the semiconductor substrate.

3. The memory cell of claim 1 wherein the doped well is formed to a depth of from about 10000 to about 15000 angstroms within the semiconductor substrate.

4. The memory cell of claim 1 further comprising a threshold adjusting dopant implanted into the sidewalls and bottom of the trench.

5. The memory cell of claim 4 wherein the threshold adjusting dopant provides a depletion mode within a metal oxide semiconductor capacitor formed from the semiconductor substrate, the capacitor dielectric layer and the capacitor plate layer.

6. The memory cell structure of claim 1 wherein the source/drain region within the field effect transistor device is electrically connected to the capacitor plate layer with a conductor spacer layer.

7. The memory cell structure of claim 1 wherein the field effect transistor device is a P channel field effect transistor device.

* * * * *